United States Patent [19]
Lawman

[11] Patent Number: 6,028,445
[45] Date of Patent: Feb. 22, 2000

[54] DECODER STRUCTURE AND METHOD FOR FPGA CONFIGURATION

[75] Inventor: Gary R. Lawman, San Jose, Calif.

[73] Assignee: Xilinx, Inc., San Jose, Calif.

[21] Appl. No.: 09/000,519

[22] Filed: Dec. 30, 1997

[51] Int. Cl.⁷ .............................. G06F 7/38; H03K 19/173
[52] U.S. Cl. ................................ 326/38; 326/39; 326/40; 326/41; 395/651
[58] Field of Search .................................. 326/39, 40, 41, 326/38; 395/651, 652, 653; 364/489

[56] References Cited

U.S. PATENT DOCUMENTS

| | | |
|---|---|---|
| Re. 34,363 | 8/1993 | Freeman . |
| 3,849,760 | 11/1974 | Endou et al. ............................ 382/205 |
| 5,084,636 | 1/1992 | Yoneda ...................................... 326/39 |
| 5,237,218 | 8/1993 | Josephson et al. ....................... 326/41 |
| 5,237,219 | 8/1993 | Cliff ......................................... 326/41 |
| 5,343,406 | 8/1994 | Freeman ................................. 364/490 |
| 5,361,224 | 11/1994 | Takasu ................................... 365/145 |
| 5,394,031 | 2/1995 | Britton et al. ............................ 326/38 |
| 5,402,014 | 3/1995 | Ziklik et al. .............................. 326/37 |
| 5,457,408 | 10/1995 | Leung ....................................... 326/38 |
| 5,493,239 | 2/1996 | Zlotnick ................................... 326/38 |
| 5,574,930 | 11/1996 | Halverson, Jr. et al. ............... 395/800 |
| 5,640,106 | 6/1997 | Erickson et al. .......................... 326/38 |
| 5,640,107 | 6/1997 | Kruse ....................................... 326/38 |
| 5,705,938 | 1/1998 | Kean ........................................ 326/39 |
| 5,808,942 | 9/1998 | Sharpe-Geisler .................... 365/189.08 |
| 5,821,772 | 10/1998 | Ong et al. ................................. 326/38 |
| 5,838,167 | 11/1998 | Erickson et al. .......................... 326/38 |
| 5,847,577 | 12/1998 | Trimberger ............................... 326/38 |

FOREIGN PATENT DOCUMENTS

| | | |
|---|---|---|
| 0253530 | 6/1987 | European Pat. Off. . |
| WO92/20157 | 11/1992 | WIPO . |
| WO94/10754 | 11/1993 | WIPO . |
| WO94/01867 | 1/1994 | WIPO . |

OTHER PUBLICATIONS

David A. Patterson and John L. Hennessy, "Computer Architecture: A Quantitive Approach", pp. 200–201, 1990.
Betty Prince, "Semiconductor Memories", copyright 1983, 1991, John Wiley & Sons, pp. 149–174.
Hodges, et al., "Analog MOS Integrated Circuits" IEEE Press, 1980, pp. 2–11.
"The Programmable Logic Data Book", published Sep., 1996, in its entirety and also specifically pp. 4–54 to 4–79 and 4–253 to 4–286, available from Xilinx, Inc., 2100 Logic Drive, San Jose, California 95124.
"Core Solutions Data Book", published May, 1997, pp. 2–5 to 2–13 available from Xilinx, Inc., 2100 Logic Drive, San Jose, California 95124.
"The Programmable Logic Data Book", published 1994, available from Xilinx, Inc., 2100 Logic Drive, San Jose, California 95124, pp. 2–105 to 2–132 and 2–231 to 2–238.
D.D. Gajski, et al., "Computer Architecture" IEEE Tutorial Manual, IEEE Computer Society, 1987, pp. v–i.
"New IEEE Standard Dictionary of Electrical and Electronics Terms", Fifth Edition, 1993, page 1011.
"IEEE Standard Test Access Port and Boundary–Scan Architecture", IEEE Std. 1149.1, published Oct. 21, 1993.

*Primary Examiner*—Michael Tokar
*Assistant Examiner*—Daniel D. Chang
*Attorney, Agent, or Firm*—Edward S. Mao, Esq. Bever & Hoffman; Lois D. Cartier

[57] ABSTRACT

A method is provided for configuring an FPGA using a decoder implemented in the FPGA. Specifically, an external configuration device or an embedded non-volatile memory configures a first portion of the FPGA as a decoder. Encoded configuration data is transferred to the decoder, which then configures other portions of the FPGA. In one embodiment, the decoder is a decompression unit, which decompresses compressed configuration data. In another embodiment, the decoder is an interpreter, which interprets configuration commands. In some embodiments, the portion of the FPGA used for the decoder can be reconfigured after the configuration of the other portions of the FPGA.

29 Claims, 16 Drawing Sheets

DECODER STRUCTURE AND METHOD FOR FPGA CONFIGURATION

CROSS-REFERENCE TO RELATED APPLICATIONS

This application relates to concurrently filed, co-pending application Ser. No. 09/001,035, "FPGA SYSTEM WITH USER-PROGRAMMABLE CONFIGURATION PORTS", by Gary R. Lawman, owned by the assignee of this application and incorporated herein by reference.

This application relates to concurrently filed, co-pending application Ser. No. 09/001,036, "CONFIGURING AN FPGA USING EMBEDDED MEMORY", by Gary R. Lawman, owned by the assignee of this application and incorporated herein by reference.

This application relates to co-pending U.S. patent application Ser. No. 08/465,134, entitled "Programmable Switch for FPGA Input/Output Signals" by Thomas A. Kean, owned by the assignee of this application and incorporated herein by reference.

This application relates to co-pending U.S. patent application Ser. No. 08/920,738, entitled "A Field Programmable Gate Array Having Programming Instructions in the Configuration Bitstream", by Stephen M. Trimberger, owned by the assignee of this application and incorporated herein by reference.

BACKGROUND OF THE INVENTION

1. Field of the Invention

The present invention relates to programmable devices such as field programmable gate arrays (FPGAs). More specifically, the present invention relates to methods for providing a programmable configuration interface to rapidly configure an FPGA.

2. Discussion of Related Art

Due to advancing semiconductor processing technology, integrated circuits have greatly increased in functionality and complexity. For example, programmable devices such as field programmable gate arrays (FPGAs) and programmable logic devices (PLDs) incorporate ever increasing numbers of functional blocks and more flexible interconnect structures to provide greater functionality and flexibility.

FIG. 1 is a simplified schematic diagram of a conventional FPGA 110. FPGA 110 includes user-programmable logic circuits (user logic) such as input/output blocks (IOBs), configurable logic blocks (CLBs), and programmable interconnect 130, which contains programmable switch matrices (PSMs). Each IOB and CLB can be configured through dedicated configuration port 120 to perform a variety of functions. Programmable interconnect 130 can be configured to provide electrical connections between the various CLBs and IOBs by configuring the PSMs and other programmable interconnection points (PIPS, not shown) through configuration port 120. Typically, the IOBs can be configured to drive output signals or to receive input signals from various pins (not shown) of FPGA 110.

FPGA 110 also includes dedicated internal logic. Dedicated internal logic performs specific functions and can be only minimally configured by a user. For example, configuration port 120 is one example of dedicated internal logic. Other examples may include dedicated clock nets (not shown), power distribution grids (not shown), and boundary scan logic (e.g. IEEE Boundary Scan Standard 1149.1, not shown).

FPGA 110 is illustrated in FIG. 1 with 16 CLBs, 16 IOBs, and 9 PSMs for clarity only. Actual FPGAs may contain thousands of CLBS, thousands of IOBs, and thousands of PSMs. The ratio of the number of CLBs, IOBs, and PSMs can also vary. Information regarding various types of FPGAs can be found in "The Programmable Logic Data Book" (hereinafter "The Xilinx 1996 Data Book"), published September, 1996 by Xilinx, Inc., and available from Xilinx, Inc., 2100 Logic Drive, San Jose, Calif. 95124.

FPGA 110 also includes dedicated configuration logic circuits to program the user logic circuits. Specifically, each CLB, IOB, PSM, and PIP contains a configuration memory (not shown) which must be configured before each CLB, IOB, PSM, or PIP can perform a specified function. Typically the configuration memories within an FPGA use static random access memory (SRAM) cells. The configuration memories of FPGA 110 are connected by a configuration structure (not shown in FIG. 1) to dedicated configuration port 120 through a dedicated external configuration access port (CAP) 125. A configuration port (a set of pins used during the configuration process) provides an interface for external configuration devices to program the FPGA. The configuration memories are typically arranged in rows and columns. The columns are loaded from a frame register which is in turn sequentially loaded from one or more sequential bitstreams. (The frame register is part of the configuration structure referenced above.) In FPGA 110, configuration access port 125 is essentially a bus access point that provides access from configuration port 120 to the configuration structure of the FPGA.

FIG. 2 illustrates a conventional method used to configure FPGA 110. Specifically, FPGA 110 is coupled to a configuration device 230 such as a serial programmable read only memory (SPROM), an electrically programmable read only memory (EPROM), or a microprocessor. Dedicated configuration port 120 receives configuration data from configuration device 230. Typically, configuration port 120 comprises a set of mode pins, a clock pin and a configuration data input pin. Configuration data from configuration device 230 is transferred serially to FPGA 110 through the configuration data input pin. In some embodiments of FPGA 110, configuration port 120 comprises a set of configuration data input pins to increase the data transfer rate between configuration device 230 and FPGA 110 by transferring data in parallel. However, due to the limited number of dedicated function pins available on an FPGA, configuration port 120 may have no more than eight configuration data input pins. Further, some FPGAs allow configuration through a boundary scan chain. Specific examples for configuring various FPGAs can be found on pages 4-54 to 4-79 of "The Xilinx 1996 Data Book," which pages are incorporated herein by reference.

As explained above, actual FPGAs can have thousands of CLBs, IOBs, PSMs, and PIPS; therefore, the amount of configuration data required to configure an FPGA can be measured in megabits. Because FPGAs are typically programmed serially or only minimally in parallel, configuring an FPGA after power-on or reset can take a significant amount of time. The configuration time for an FPGA is further lengthened because most configuration devices (e.g., SPROMS) have slow access times and slow data transfer rates. As FPGAs become even more complex, long configuration times may violate startup requirements in some systems after power-on or reset. Further, as the amount of configuration data increases, the cost of configuration device 230 may begin to impact the cost of the overall system using FPGAs. Hence, there is a need for a method and structure for rapidly configuring FPGAs while reducing the cost of any necessary configuration devices.

SUMMARY

The present invention uses high-speed devices, embedded memories, or decoders to rapidly configure an FPGA. In accordance with one embodiment of the present invention, a decoder is used to reduce the size of the configuration data. Specifically, the user logic circuits of a first portion of the FPGA are configured to function as a decoder using a dedicated external configuration access port. Encoded configuration data is transferred to the decoder and decoded therein. Then a second portion of the FPGA is configured using the decoded configuration data. The decoder programs the configuration memory of the FPGA through an internal configuration access port that is accessible from the user logic. While a dedicated external configuration access port connects dedicated configuration pins to the configuration structure, an internal configuration access port programmably connects programmable pins (such as IOBs) or other user logic (such as CLBs) to the configuration structure. An external configuration device or an embedded non-volatile memory in the FPGA can configure the first portion of the FPGA. Two types of decoders compatible with the invention are a decompression unit and an interpreter. For the decompression unit, the encoded configuration data for the second portion of the FPGA is compressed. For the interpreter, the encoded configuration data for the second portion of the FPGA comprises configuration commands. Another feature of the present invention is that in some embodiments the first portion of the FPGA can be reconfigured after configuration of the second portion is complete to implement additional logic functions. These logic functions can be operatively coupled to the second portion of the FPGA.

Another embodiment of the present invention uses a high-speed device to configure the FPGA. Either an external configuration device or an embedded non-volatile memory is used to configure the user logic circuits of a first portion of the FPGA. Specifically, the first portion of the FPGA is configured to function as a user logic configuration port, which can interface with the high-speed device. (The term "user logic configuration port" means a configuration port formed by programming user logic such as IOBs and possibly CLBs. A "dedicated configuration port" includes pins that are designed specifically for use as configuration pins, although they may have other functions after configuration.) The high-speed device then sends configuration data through the user logic configuration port to configure a second portion of the FPGA. (The user logic configuration port connects to the configuration memory of the FPGA through an internal configuration access port.) In one embodiment, after the second portion of the FPGA is configured, the external configuration device or the embedded non-volatile memory can reconfigure the first portion of the FPGA. In some embodiments, the configuration port for the high-speed device (i.e., the user logic configuration port) receives data in parallel on a plurality of configuration data input pins.

Another embodiment of the present invention uses an embedded non-volatile memory to partially configure the FPGA. Specifically, the embedded non-volatile memory comprises a first set of configuration data which configures a specialized logic function in a first portion of the FPGA. The embedded non-volatile memory or an external configuration device can configure the other portions of the FPGA. The embedded non-volatile memory programs the configuration memory of the FPGA through an internal configuration access port. One use for this embodiment is to embed proprietary logic functions into FPGAs, which can be sold to and by other parties.

Thus, the present invention advantageously enables the rapid and cost-effective programming of FPGAs. The present invention will be more fully understood in view of the following description and drawings.

DETAILED DESCRIPTION

Figure 3:
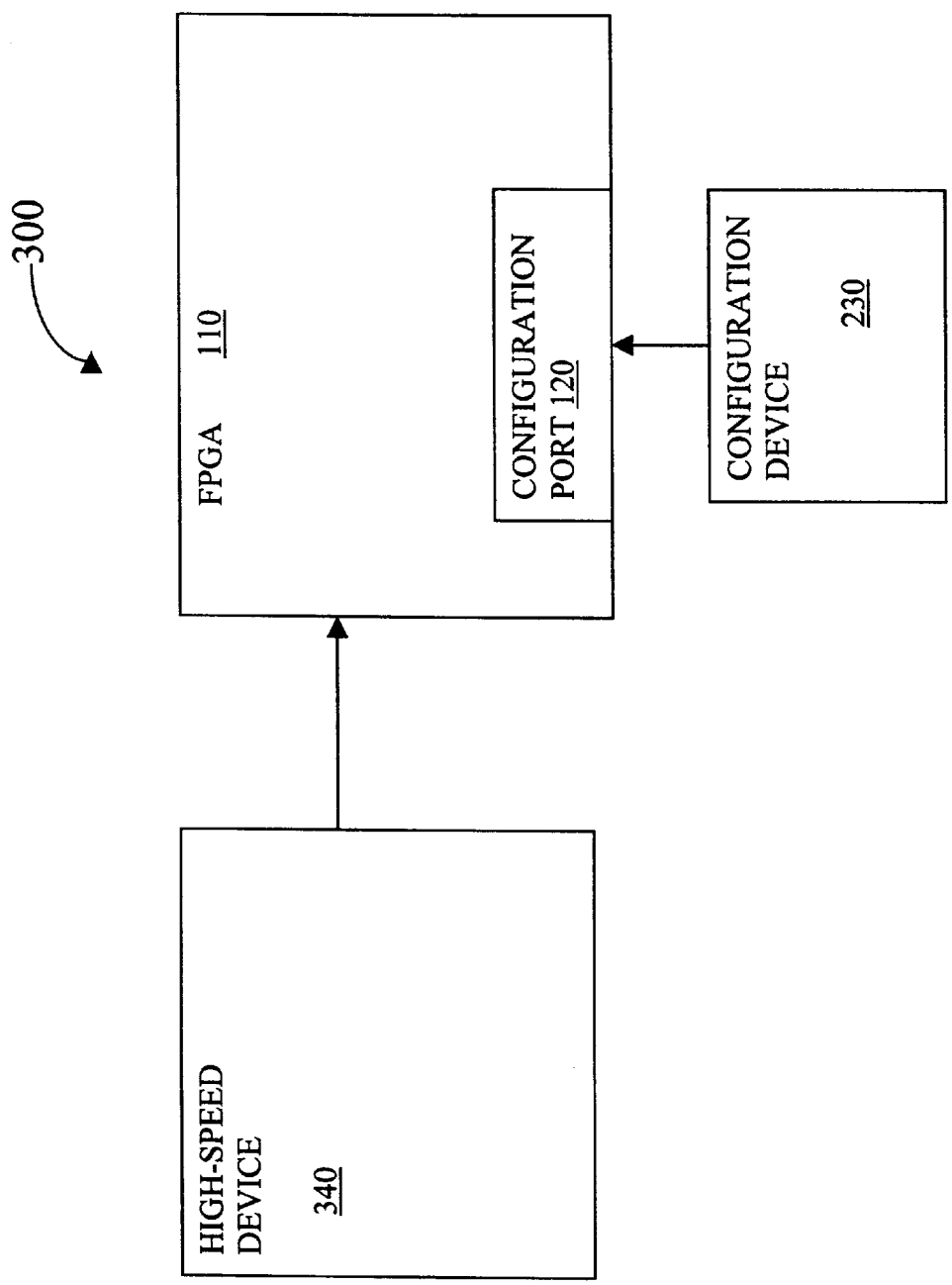
FIG. 3 is a schematic diagram of a prior art system using an FPGA.

FIG. 3 is a schematic diagram of a typical prior art system 300 using FPGA 110 with a high-speed device 340 and a configuration device 230. High-speed device 340 can be, for example: a microprocessor using architectures such as x86, PowerPC, MIPs, Alpha, or ARM; a bus, such as PCI, ISA, or EISA; another FPGA; or a high-speed memory system.

Conventionally, FPGA 110 must be configured by configuration device 230 before high-speed device 340 can access FPGA 110. Therefore, after power-on or reset, parts of system 300 must remain idle until after configuration device 230 configures FPGA 110. Further, the cost of system 300 is increased by the cost of configuration device 230, which can be significant for a large FPGA.

Figure 4:
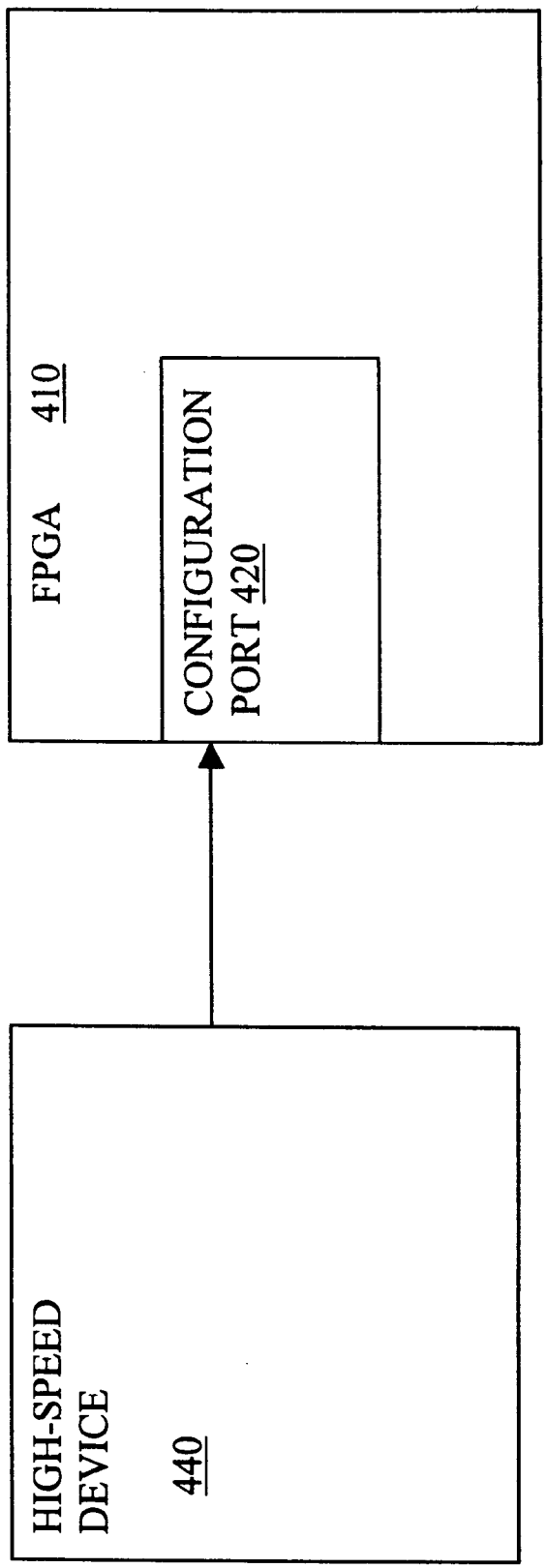
FIG. 4 is a schematic diagram of a prior art system for programming an FPGA.

FIG. 4 shows one known solution to the problems of configuring an FPGA 410. A dedicated configuration port 420 of FPGA 410 is designed specifically to interface to a particular high-speed device 440. As explained above, the high-speed device varies from system to system. Therefore, FPGA 410 must be customized by the manufacturer of the FPGA for each high-speed device a user may wish to use.

However, FPGAs derive a benefit over custom circuits specifically because FPGAs are mass-produced to be used in various systems without customization by the manufacturer. Therefore, creating different kinds of FPGAs customized with configuration ports specifically for each different high-speed device is not desirable.

Programmed Configuration Port

Figure 5:
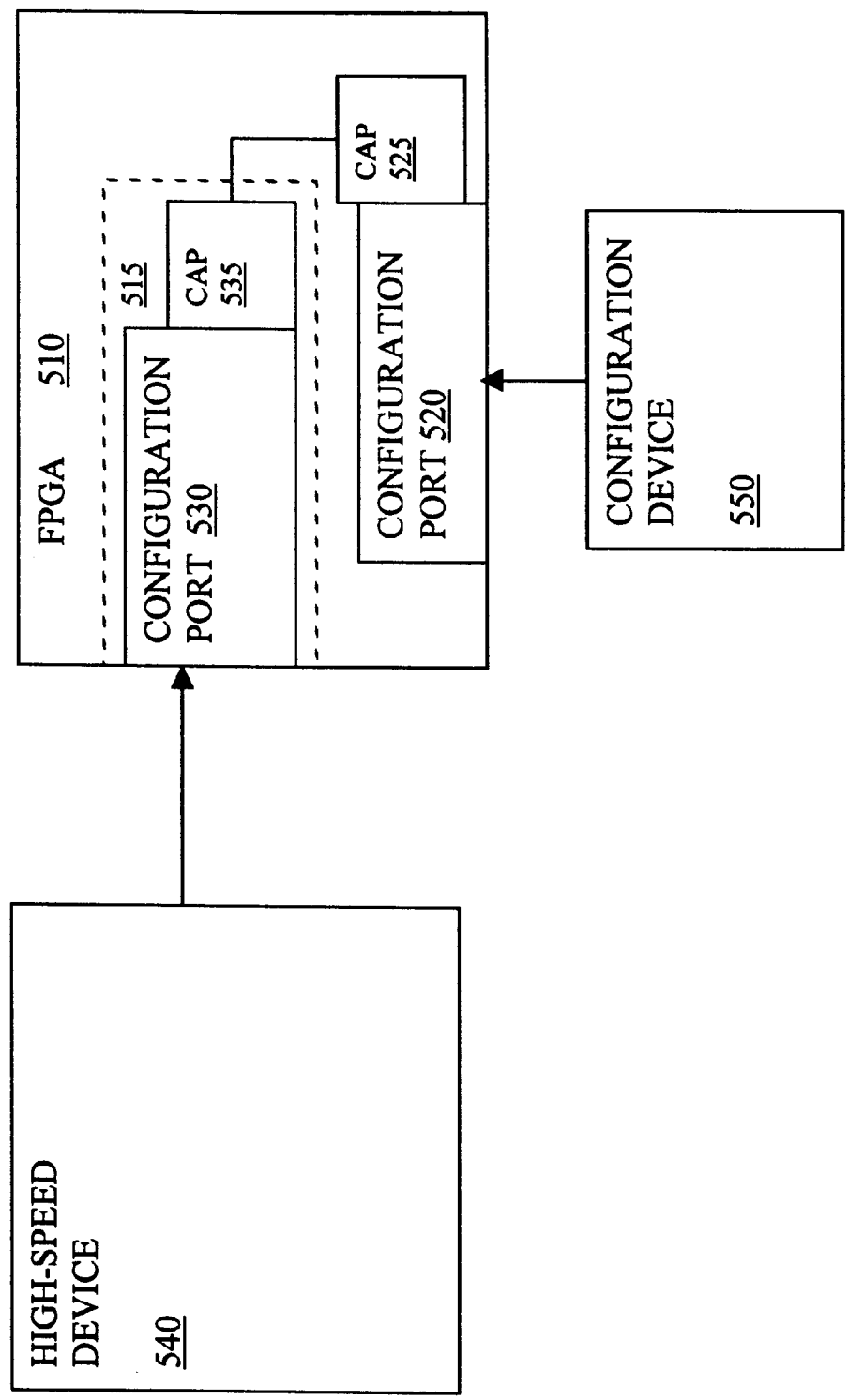
FIG. 5 is a schematic diagram of a system for programming an FPGA in accordance with one embodiment of the present invention.

FIG. 5 shows one embodiment of the present invention providing fast configuration of FPGAs having a partial configuration feature, i.e., configuration of portions of the FPGA without having to configure the entire FPGA. The present invention also reduces the cost of configuration devices. Specifically, an FPGA 510 is coupled to a configuration device 550 through a dedicated configuration port 520. Configuration port 520 is coupled to a configuration structure (not shown) through a dedicated external configuration access port (CAP) 525. One FPGA with a configuration port, configuration access port, and configuration structure is described in detail in U.S. patent application Ser. No. 08/465,134, entitled "Programmable Switch for FPGA Input/Output Signals" by Thomas A. Kean, referenced above and incorporated herein by reference. (See in particular Kean's FIG. 5.) In one embodiment, dedicated configuration port 520 comprises boundary scan logic (e.g. IEEE Boundary Scan Standard 1149.1).

After power-on or reset, configuration device 550 partially configures FPGA 510 by configuring a portion 515 of FPGA 510. Portion 515 includes an internal configuration access port 535, CLBs, IOBs, PSMS, and PIPs (not shown). Configuration device 550 configures the user logic circuits of portion 515 as a second configuration port 530. User logic configuration port 530 can be configured to interact specifically with high-speed device 540. One high-speed port that can be implemented in an FPGA is the PCI interface, a design for which is available from Xilinx, Inc. This product is described on pages 2-5 to 2-13 of the "Core Solutions Data Book", published May 1997 and available from Xilinx, Inc., 2100 Logic Drive, San Jose, Calif. 95124, which pages are incorporated herein by reference. The Xilinx PCI interface is one example of a port that could be used as configuration port 530 if targeted to FPGA 510. Once configuration device 550 configures configuration port 530, high-speed device 540 can configure other portions of FPGA 510 through user logic configuration port 530 and internal configuration access port 535. (Dedicated configuration port 520 and dedicated external configuration access port 525 are not reconfigured, because they are not implemented in user logic, but are dedicated internal logic.) Internal configuration access port 535 is accessible from user logic.

If configuration port 530 is not needed after high-speed device 540 configures the other portions of FPGA 510, the user logic circuits of portion 515 of FPGA 510 which were used to implement configuration port 530 can be reconfigured to perform additional functions.

If high-speed device 540 reconfigures portion 515 of FPGA 530, high-speed device 540 must maintain access to configuration access port 535 until the reconfiguration process is complete. Therefore, portion 515 cannot be entirely reconfigured by high-speed device 540. However, high-speed device 540 may first partially reconfigure portion 515 of FPGA 510 as a high-speed serial access configuration port so that the majority of portion 515 and most of the pins used for configuration port 530 can then be reconfigured to perform additional logic functions. The logic implemented in the reconfigured portion of FPGA 510 can be either independent logic functions or operatively coupled to logic implemented in the other portions of FPGA 510.

Alternatively, because configuration device 550 can program the configuration memories through dedicated configuration port 520 and dedicated external configuration access port 525, configuration device 550 can reconfigure all of portion 515 of FPGA 510. In some embodiments, high-speed device 540 must inform configuration device 550 when high-speed device 540 completes configuration of the other portions of FPGA 510. If configuration device 550 is a single memory circuit, the configuration data for configuration port 530 can be stored on one page of memory while the configuration data for the reconfiguration of portion 515 can be stored on a second page of memory. Alternatively, configuration device 550 may comprise multiple memories, such as one SPROM containing configuration data for configuration port 530 and a second SPROM containing configuration data to reconfigure portion 515.

Since configuration port 530 can be reconfigured as circuits useful after completion of the configuration process, configuration port 530 can use a large number of pins for receiving configuration data from high-speed device 540. Thus, configuration port 530 can be highly parallel. For example, configuration port 530 may have 32 configuration data input pins if high-speed device 540 is a 32-bit microprocessor or other device using a 32-bit bus. Similarly, configuration port 530 may have 16 configuration data input pins if high-speed device 540 is a 16-bit microprocessor or other device using a 16-bit bus. Further, high-speed device 540 can generally transfer data at a faster rate than standard configuration devices such as SPROMs. Thus, creating a second configuration port in accordance with one embodiment of the present invention can greatly reduce the configuration time of an FPGA. Configuration port 530 may also have a plurality of control pins to enable the interface to high-speed device 540.

Figure 1:
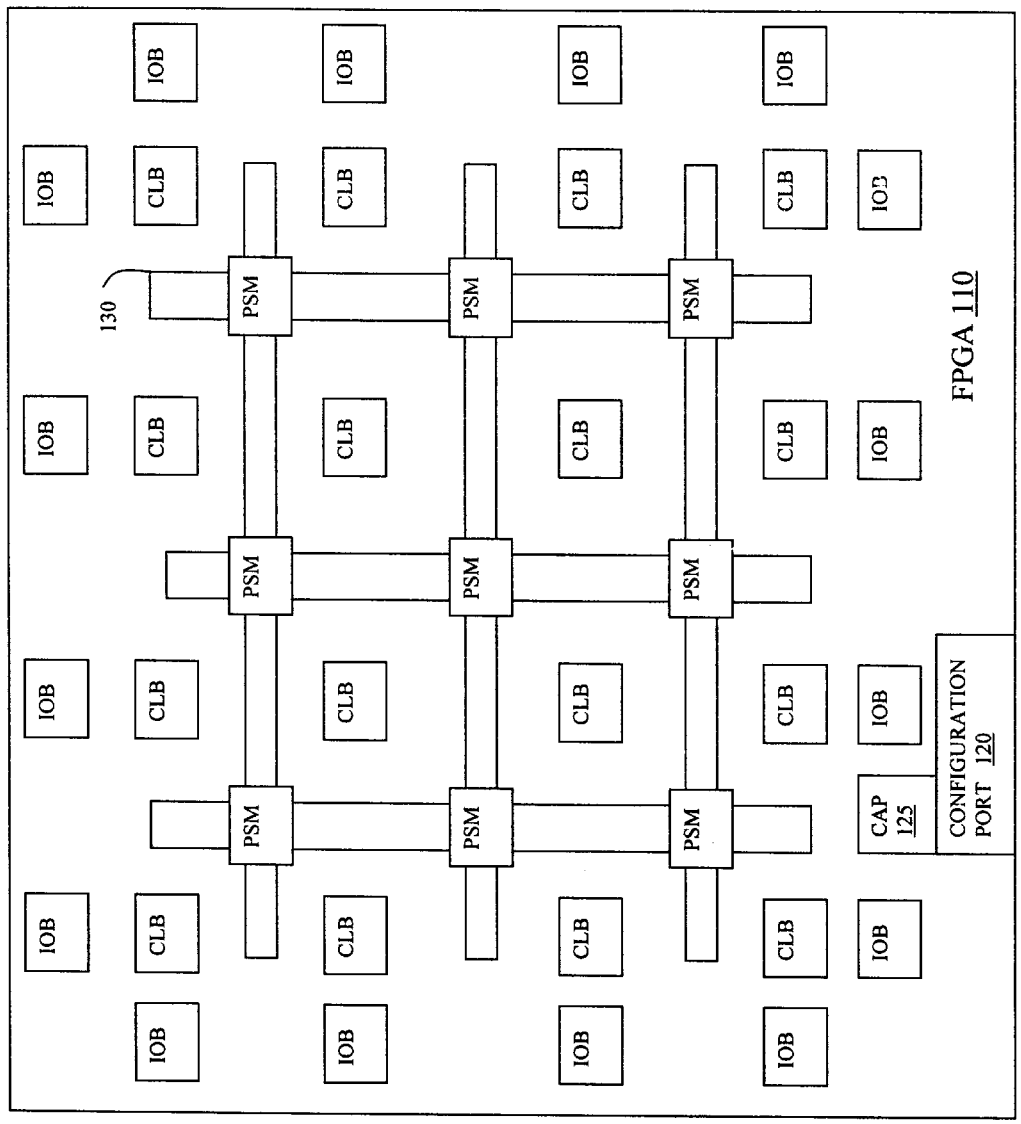
FIG. 1 is a simplified schematic diagram of a conventional FPGA.
Figure 2:
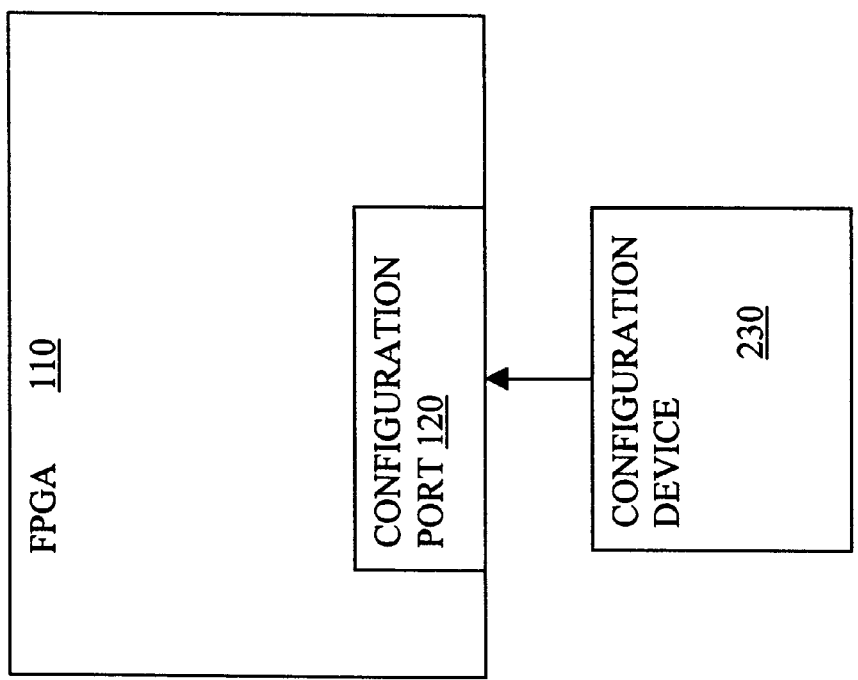
FIG. 2 is a prior art schematic diagram of an FPGA configured with a configuration device.

Further, because configuration device 550 only needs to configure portion 515 of FPGA 510, configuration device 550 can contain far less configuration data than is needed by configuration device 230 (FIGS. 2 and 3). Thus, configuration device 550 can be smaller and less expensive than configuration device 230.

Figure 6:
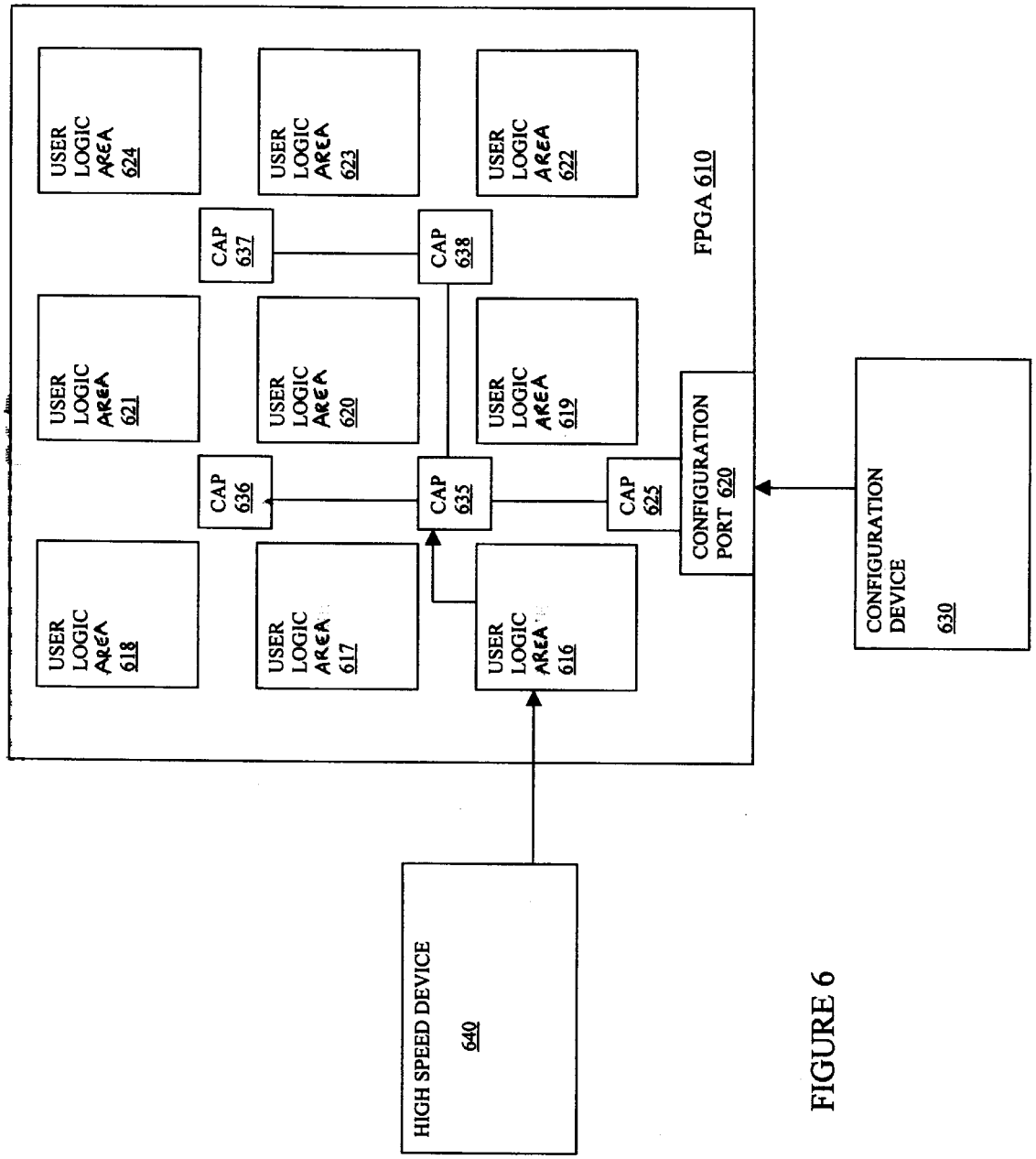
FIG. 6 is a schematic diagram of a system for programming an FPGA in accordance with one embodiment of the present invention.

FIG. 6 shows a system for configuring an FPGA 610 in accordance with one embodiment of the invention. Specifically, FPGA 610 includes an array of substantially identical user logic areas that include groups of CLBs, IOBs, PSMs, and PIPs. Further, FPGA 610 includes internal configuration access ports 635, 636, 637, and 638, all accessing the configuration structure (not shown) of FPGA 610. Dedicated configuration port 620 connects to the configuration structure of FPGA 610 via dedicated external configuration access port 625. Using configuration access port 625, configuration device 630 configures one or more user logic areas, such as user logic area 616, to interface with a high-speed device 640. Further, configuration device 630 configures user logic area 616 with the ability to program the configuration memory of FPGA 610 through internal configuration access port 635. High-speed device 640 then configures the remaining user logic areas as necessary, e.g. user logic areas 617–624. In addition, user logic area 616 can be reconfigured by either high-speed device 640 or by configuration device 630. The XC6200™ family of FPGAs, which are available from Xilinx, Inc., 2100 Logic Drive, San Jose, Calif. 95124, are a specific example of FPGAs which allow partial configuration. The XC6200 family of FPGAs is described in "The Xilinx 1996 Data Book", pages 4-253 to 4-286, which are incorporated herein by reference. An FPGA providing multiple configuration access ports is described by Freeman and Hsieh in U.S. Pat. No. 5,343,406, "Distributed Memory Architecture for a Configurable Logic Array and Method for Using Distributed Memory", which is incorporated herein by reference and title to which is held by the assignee hereof.

Configuring Through a User Logic Decoder

Figure 7:
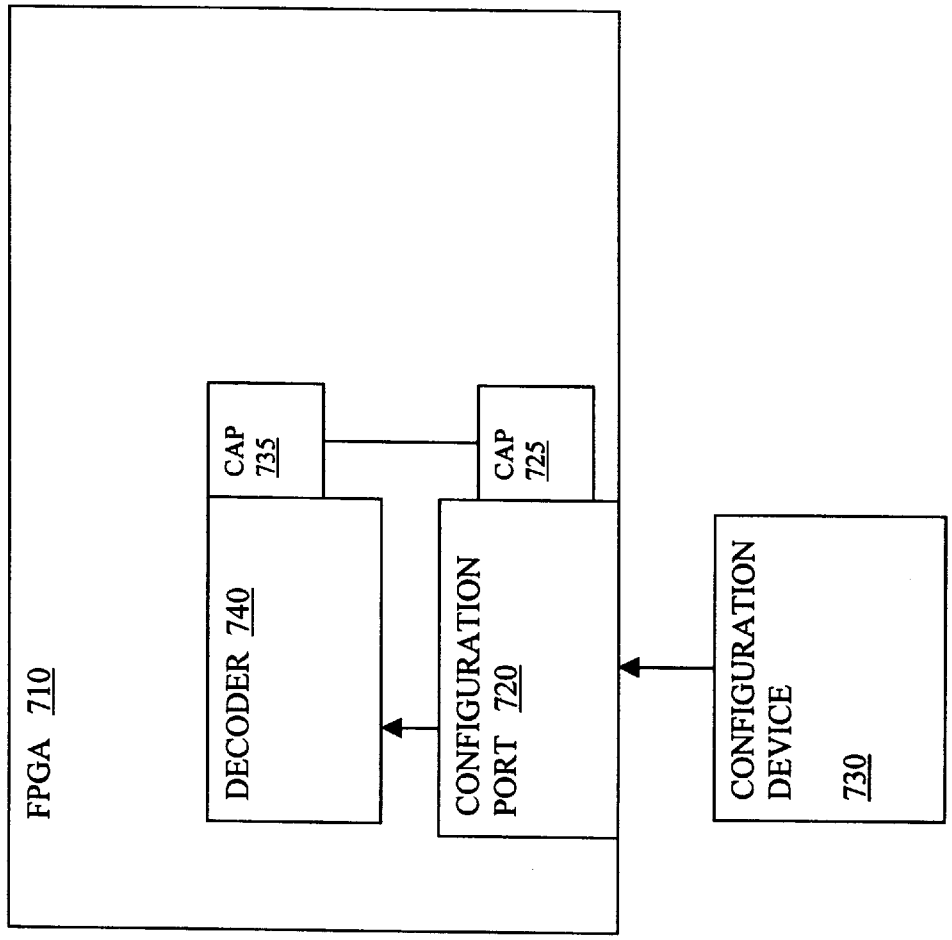
FIG. 7 is a schematic diagram of a system for programming an FPGA with a decoder in accordance with one embodiment of the present invention.

FIG. 7 illustrates another embodiment of the present invention. This embodiment decreases the configuration time of an FPGA 710 and reduces the amount of data transferred between a configuration device 730 and FPGA 710. Specifically, configuration device 730 configures the user logic circuits of a portion of FPGA 710 to function as a decoder 740 through dedicated configuration port 720 and dedicated external configuration access port 725. Decoder 740 can be placed anywhere in the CLB array provided that decoder 740 can access the configuration memories of the other portions of FPGA 710 through an internal configuration access port 735. After configuring decoder 740, configuration device 730 sends configuration data in an encoded format to decoder 740 through configuration port 720. The encoded configuration data need not pass through configuration access port 725. In order to implement this embodiment of the invention, decoder 740 must have access to the encoded data from configuration port 720 through the programmable interconnect. Decoder 740 then decodes the encoded configuration data and configures other portions of FPGA 710, using the decoded configuration data. After the other portions of FPGA 710 are configured, configuration device 730 can reconfigure the portion of FPGA 710 used for decoder 740 to perform additional logic functions. The logic implemented in the reconfigured portion of FPGA 710 can be either independent logic functions or operatively coupled to logic functions implemented in other portions of FPGA 710.

Users of FPGA 710 and configuration device 730 may select specific encoding algorithms based on the effectiveness of the particular algorithm on the specific data required by the user. Two decoders compatible with the invention are a decompression unit (discussed with reference to FIGS. 9 and 10) and an interpreter (discussed with reference to FIG. 11).

Figure 8:
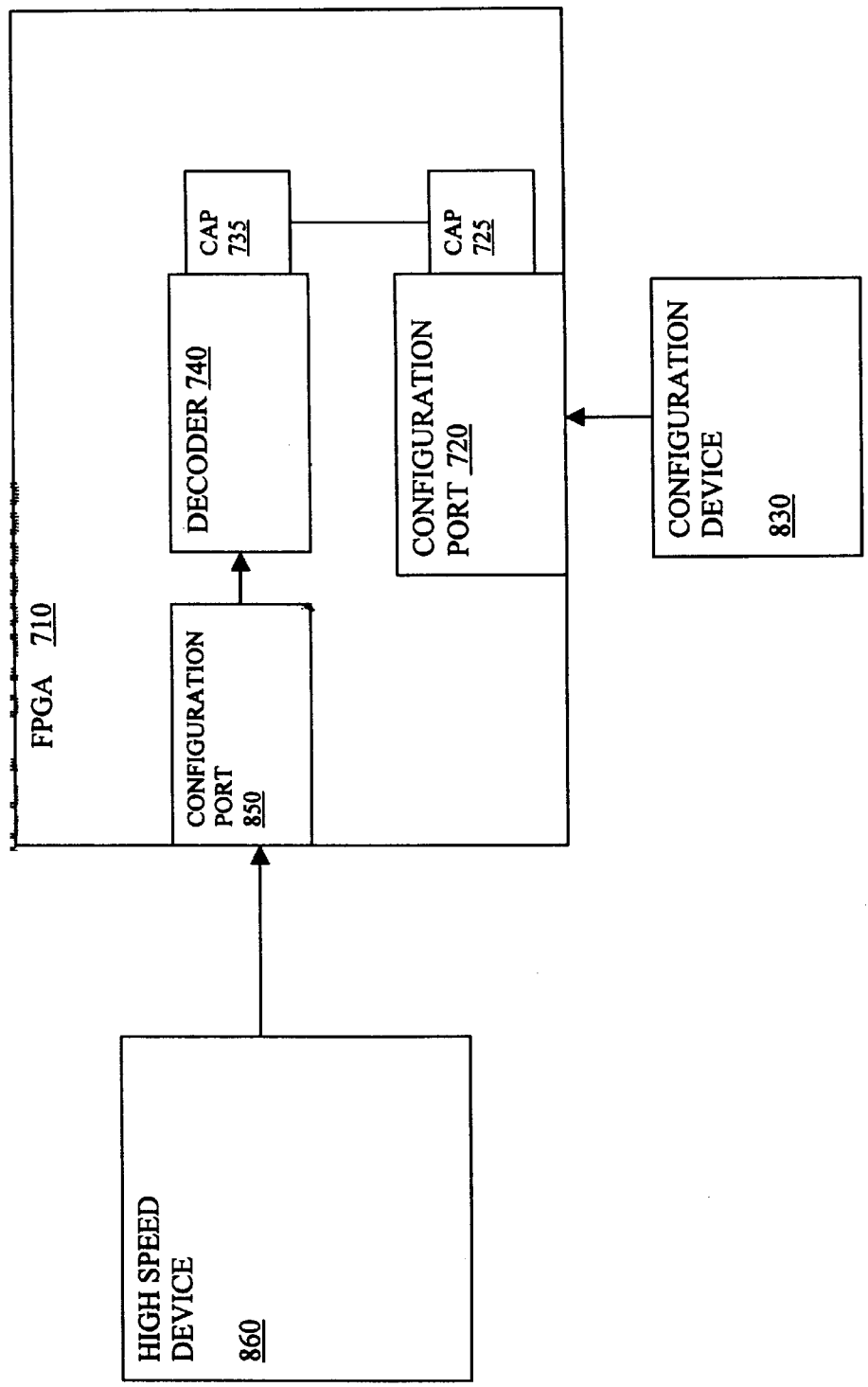
FIG. 8 is a schematic diagram of a system for programming an FPGA with a decoder and including a high-speed device in accordance with one embodiment of the present invention.

FIG. 8 shows an enhancement to the embodiment of the present invention shown in FIG. 7. If FPGA 710 is used with a high-speed device 860, a configuration device 830 can configure the user logic circuits of a second portion of FPGA 710 as a user logic configuration port 850 through dedicated configuration port 720 and dedicated external configuration access port 725. User logic configuration port 850 is programmed to interface specifically with high-speed device 860. After configuration of configuration port 850 and decoder unit 740, high-speed device 860 transfers encoded configuration data to decoder 740 through configuration port 850 to configure the other portions of FPGA 710 through internal configuration access port 735. Once the other portions of FPGA 710 are configured, the portions of FPGA 710 used for decoder 740 and user logic configuration port 850 can be reconfigured to perform additional logic functions by either high-speed device 860 or configuration device 830. The embodiment of FIG. 8 reduces the configuration time of FPGA 710 over the embodiment of FIG. 7 by transferring encoded configuration data at high speed and in parallel through configuration port 850. Further, the cost of configuration device 830 is less than that of configuration device 730 because configuration device 830 only needs to contain enough configuration data to configure a relatively small portion of FPGA 710.

Figure 9:
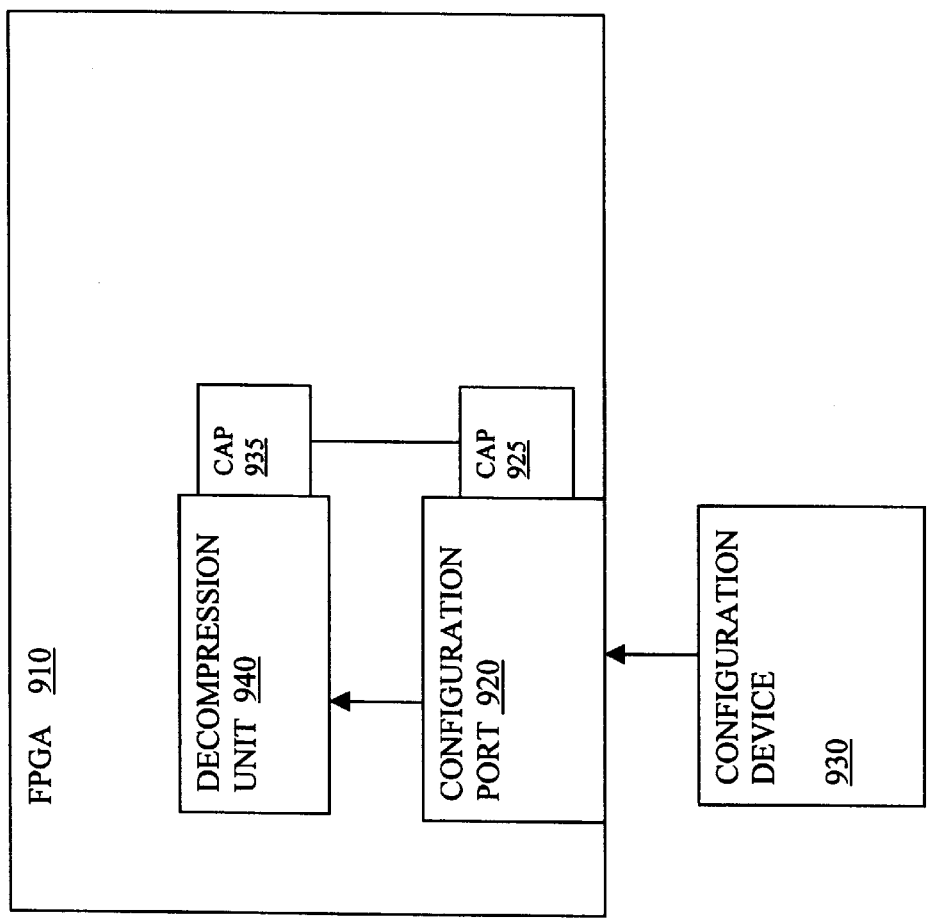
FIG. 9 is a schematic diagram of a system for programming an FPGA with a decompression unit in accordance with one embodiment of the present invention.

FIG. 9 shows a specific implementation of the embodiment of FIG. 7, wherein the decoder of FIG. 7 is configured as a decompression unit. Thus, configuration device 930 configures the user logic circuits of a portion of FPGA 910 as a decompression unit 940 through dedicated configuration port 920 and dedicated external configuration access port 925. Configuration device 930 configures decompression unit 940 with the ability to program the configuration memories of the other portions of FPGA 910 through internal configuration access port 935. After configuring decompression unit 940, configuration device 930 sends configuration data in a compressed format to decompression unit 940. The compressed configuration data need not pass through configuration access port 925. In order to implement this embodiment of the invention, decompression unit 940 must have access to the compressed data from configuration port 920 through the programmable interconnect. Decompression unit 940 then decompresses the compressed configuration data and configures the other portions of FPGA 910 using the decompressed configuration data. Decompression unit 940 can also be used to decompress user data to be stored in FPGA 910. Once decompression unit 940 is no longer needed, configuration device 930 can reconfigure the portion of FPGA 910 used for decompression unit 940 to perform additional logic functions. The logic implemented in the reconfigured portion of FPGA 910 can be either independent logic functions or operatively coupled to logic functions implemented in other portions of FPGA 910.

Users of FPGA 910 and configuration device 930 may select specific compression algorithms based on the effectiveness of the particular algorithm on the specific data required by the users. For example, run length encoding may produce a high compression ratio on one set of configuration data while LEMPEL-ZIV compression may produce a high compression ratio on another set of configuration data.

Since the majority of the configuration data transferred by configuration device 930 to FPGA 910 is compressed, the configuration time for FPGA 910 is reduced. The cost of configuration device 930 is also reduced because the compressed configuration data requires less storage space than uncompressed configuration data.

Further, some FPGAs may contain user memory for user data. If initial user data is necessary in the configuration of an FPGA, the configuration time of the FPGA can be reduced by compressing the initial user data in configuration device 930 and using decompression unit 940 to decompress the initial user data before storing the user data in the FPGA's user memory. The cost of configuration device 930 is also reduced because the compressed initial user data requires less storage space in configuration device 930 than uncompressed user data.

Figure 10:
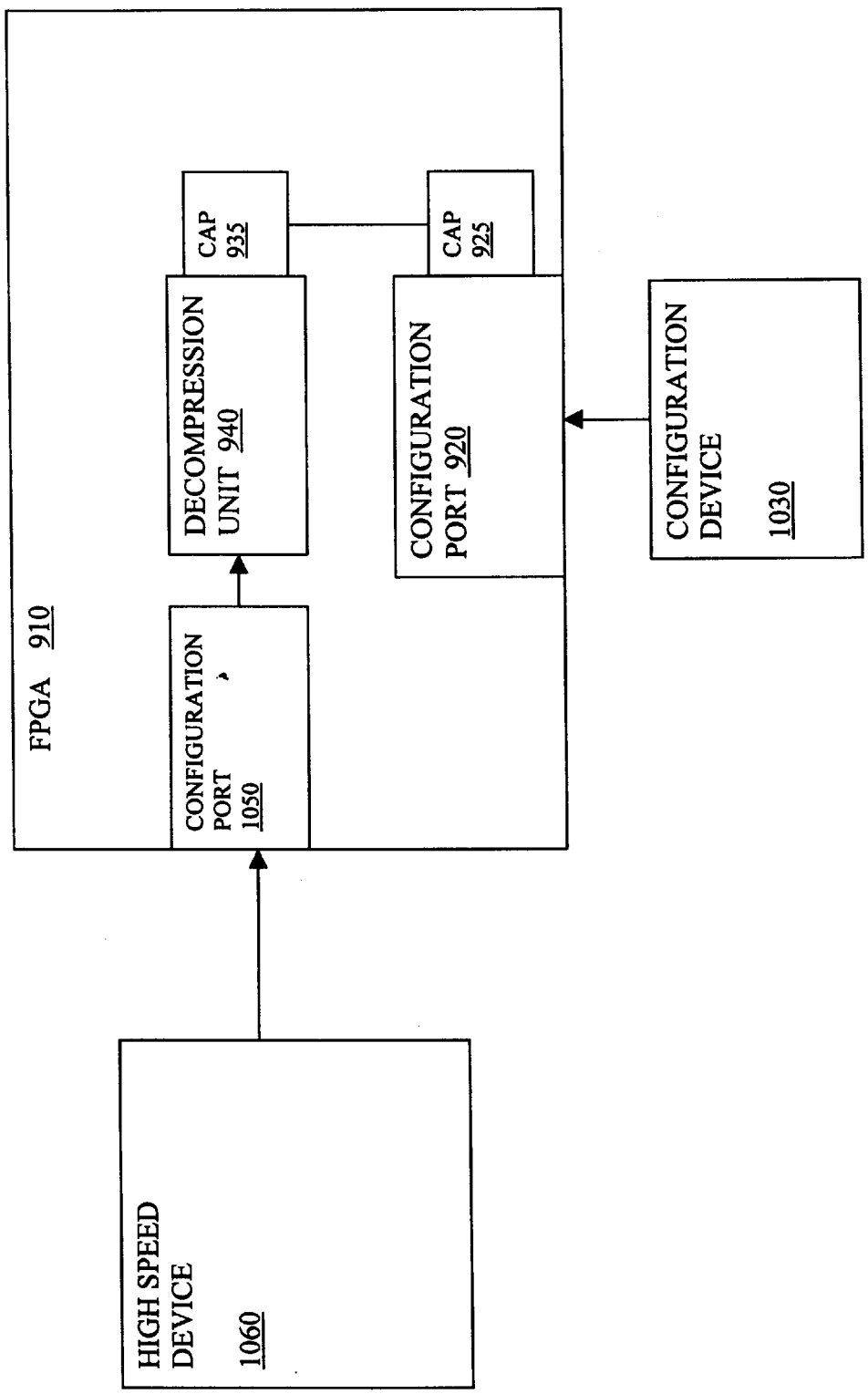
FIG. 10 is a schematic diagram of a system for programming an FPGA with a decompression unit and including a high-speed device in accordance with one embodiment of the present invention.

FIG. 10 shows an enhancement to the embodiment of the present invention shown in FIG. 9. If FPGA 910 is to be used with a high-speed device 1060, configuration device 1030 can configure the user logic circuits of a second portion of FPGA 910 as a user logic configuration port 1050 through dedicated configuration port 920 and dedicated external configuration access port 925. User logic configuration port 1050 is configured to interface specifically with high-speed device 1060. After configuration of configuration port 1050 and decompression unit 940, high-speed device 1060 sends compressed configuration data to decompression unit 940 through configuration port 1050. Decompression unit 940 decompresses the compressed configuration data and configures the other portions of FPGA 910 through internal configuration access port 935. Once the other portions of FPGA 910 are configured, the portions of FPGA 910 used for decompression unit 940 and configuration port 1050 can be reconfigured to perform additional logic functions by either high-speed device 1060 or configuration device 930, as described above. The embodiment of FIG. 10 reduces the configuration time of FPGA 910 over the embodiment of FIG. 9 by transferring compressed configuration data at high speed and in parallel through configuration port 1050. The cost of configuration device 930 is also reduced because configuration device 930 only needs to contain enough configuration data to configure two relatively small portions of FPGA 910.

Figure 11:
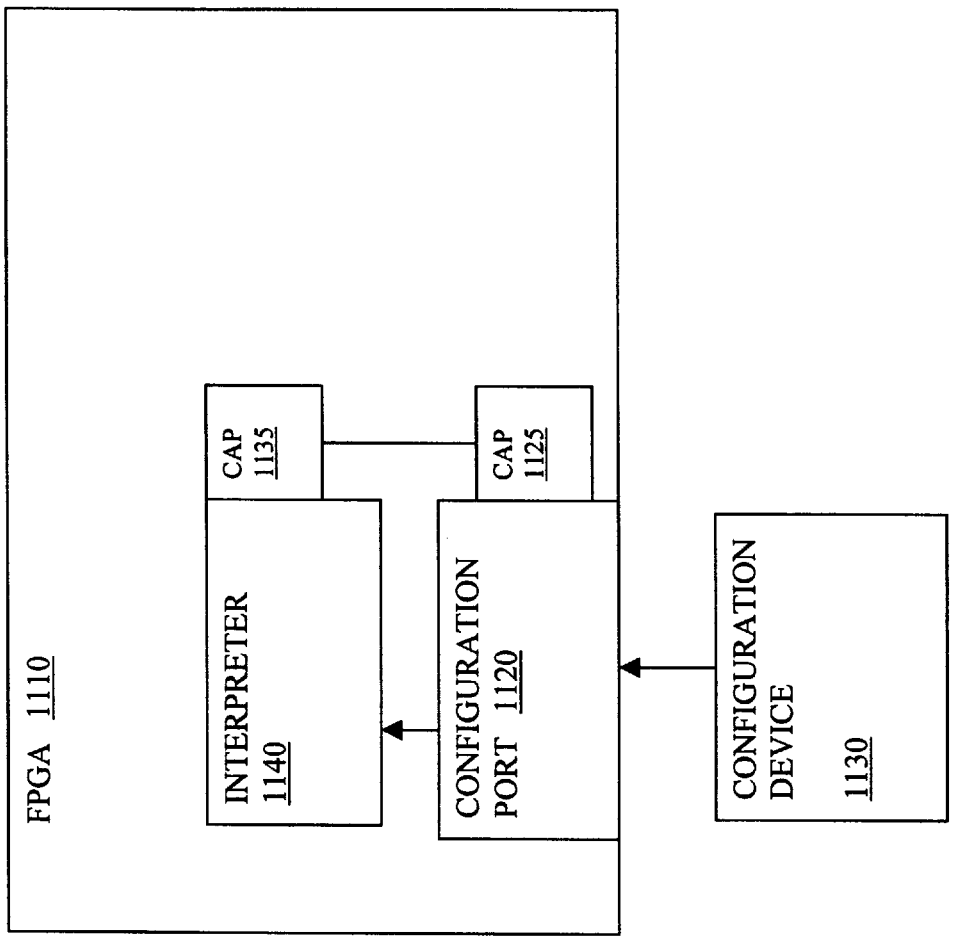
FIG. 11 is a schematic diagram of a system for programming an FPGA with an interpreter in accordance with one embodiment of the present invention.

FIG. 11 illustrates another implementation of the embodiment of FIG. 7, wherein the decoder of FIG. 7 is configured to be an interpreter. The interpreter receives configuration commands and interprets the configuration commands to configure other portions of FPGA 1110. Users of FPGA 1110 and configuration device 1130 may select specific configuration command languages based on the benefits of the particular language. One such configuration command language is described by Trimberger in co-pending U.S. patent application Ser. No. 08/920,738, entitled "A Field Programmable Gate Array Having Programming Instructions in the Configuration Bitstream", by Stephen M. Trimberger, which is incorporated herein by reference.

Configuration device 1130 configures the user logic circuits of a portion of FPGA 1110 as an interpreter 1140 through dedicated configuration port 1120 and dedicated external configuration access port 1125. Interpreter 1140 is configured to be able to program the configuration memories of the other portions of FPGA 1110 through internal configuration access port 1135. After configuring interpreter 1140, configuration device 1130 sends configuration commands to interpreter 1140. Interpreter 1140 then interprets the configuration commands and configures the other portions of FPGA 1110 through configuration access port 1135. Sample configuration commands including program row, load frame, and read back are explained in detail by Trimberger in U.S. patent application Ser. No. 08/920,738. After the other portions of FPGA 1110 are configured, configuration device 1130 can reconfigure the portion of FPGA 1110 used for interpreter 1140 to perform additional functions. The logic implemented in the reconfigured portion of FPGA 110 can be either independent logic functions or operatively coupled to logic functions implemented in other portions of FPGA 110. This embodiment can also be enhanced by the addition of a high-speed device and a user logic configuration port similar to the embodiment of FIG. 10.

Configuring from Embedded Non-Volatile Memory

Figure 12:
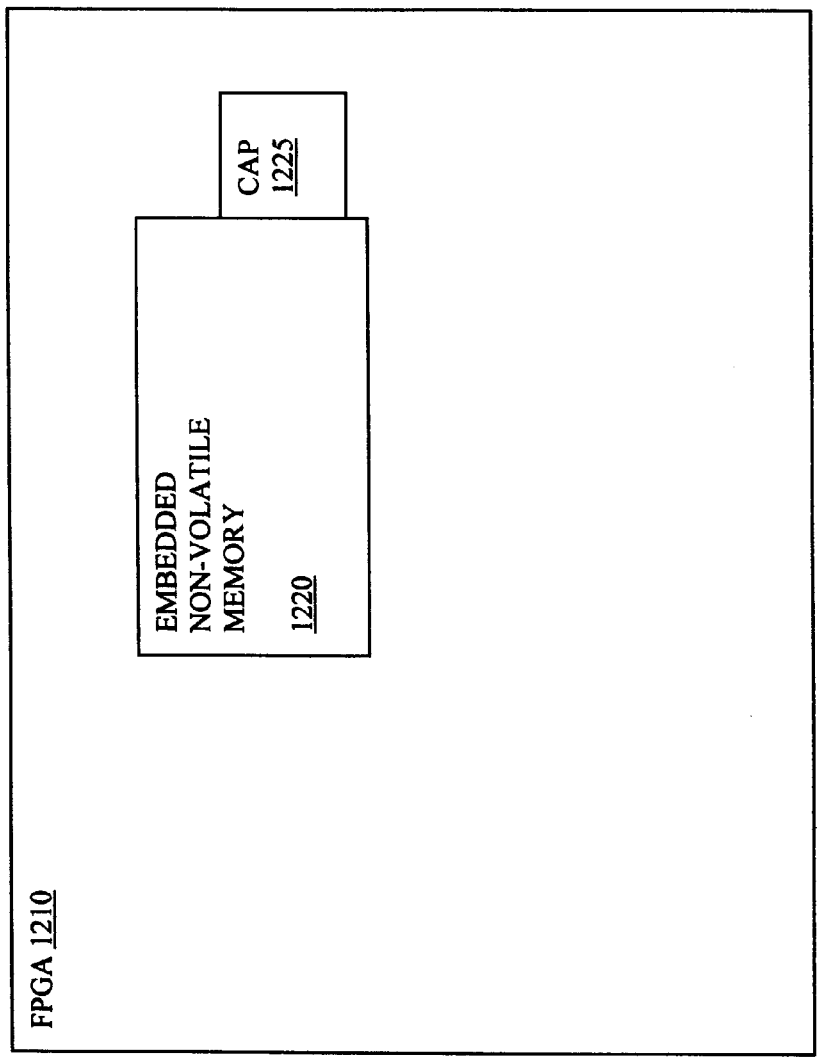
FIG. 12 is a schematic diagram of an FPGA with an embedded non-volatile memory.

Many FPGAs contain embedded non-volatile memory for customization by users of the FPGAs. FIG. 12 shows another embodiment of the present invention, which uses the embedded non-volatile memory of an FPGA for configuration of the FPGA. Specifically, FPGA 1210 comprises an embedded non-volatile memory 1220 that is coupled to the configuration memories (not shown) of FPGA 1210 through an internal configuration access port 1225. Thus, on power-on, reset, or when directed by a user, embedded non-volatile memory 1220 can partially or completely configure FPGA 1210. Embedded non-volatile memory 1220 can be mask programmed (e.g., metal mask programmed) by the manufacturer of the FPGA, or embedded non-volatile memory 1220 can be user programmable (e.g. if embedded non-volatile memory 1220 is a flash ROM, PROM, or EPROM). Because embedded non-volatile memory 1220 is contained within FPGA 1210, embedded non-volatile memory 1220 can configure FPGA 1210 very rapidly. The configuration can occur at the full speed of the FPGA rather than at the speed of an external configuration device.

Figure 13:
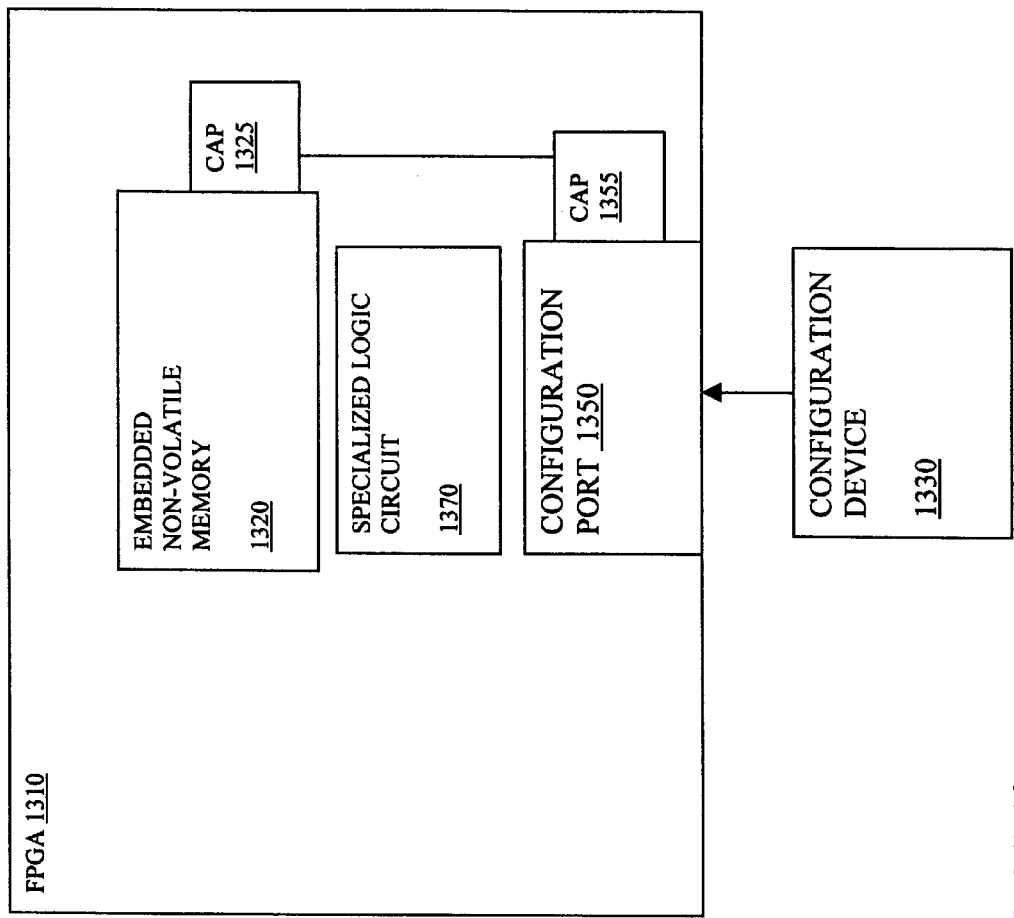
FIG. 13 is a schematic diagram of an FPGA with an embedded non-volatile memory to partially configure the FPGA in accordance with one embodiment of the present invention.

However, using mask-programmed memory or storing the configuration data of FPGA 1210 within embedded non-volatile memory 1220 may consume too much area within FPGA 1210. Therefore, using embedded non-volatile memory 1220 to partially configure FPGA 1210 may be more economically feasible. For example, in FIG. 13, FPGA 1310 includes an embedded non-volatile memory 1320 coupled to an internal configuration access port 1325, so that configuration data within embedded non-volatile memory 1320 can configure a portion of FPGA 1310. FPGA 1310 also includes a dedicated configuration port 1350 coupled to a dedicated external configuration access port 1355. A configuration device 1330 can use dedicated configuration port 1350 and dedicated external configuration access port 1355 to configure those portions of FPGA 1310 not configured by embedded non-volatile memory 1320.

Incorporating embedded non-volatile memory 1320 in FPGA 1310 allows custom and even proprietary configuration data to be included in FPGA 1310. For example, a third party may design a specialized logic circuit 1370, such as a processor core or a digital signal processor, using a portion of FPGA 1310. The third party can then purchase FPGAs from the manufacturer of the FPGA and store configuration data for the specialized logic circuit in embedded non-volatile memory 1320. Alternatively, the third party can have the manufacturer of FPGA 1310 program non-volatile memory 1320 using a metal mask layer. Such metal mask programming is well known in the art, for example in the manufacture of gate arrays.

On power-on or reset, non-volatile memory 1320 configures the user logic circuits of a portion of FPGA 1310 as specialized logic circuit 1370. Then, the user of FPGA 1310 can configure the other portions of FPGA 1310 through configuration port 1350 and configuration access port 1355 using configuration device 1330. In one embodiment, the third party can configure FPGA 1310 so that the configuration data in embedded non-volatile memory 1320 cannot be accessed after FPGA 1310 is sold to the end user. Thus, third parties can embed proprietary circuits in FPGA 1310 and sell FPGA 1310 to end users without releasing the configuration data for the specialized logic circuit. Of course a single user (as well as a third party) can also embed logic circuits using embedded non-volatile memory 1320 while still using configuration port 1350. In one embodiment, the user can verify the status of embedded non-volatile memory 1320 by reading a version number, CRC (Cyclic Redundancy Check) value, vendor ID, and so forth.

Figure 14:
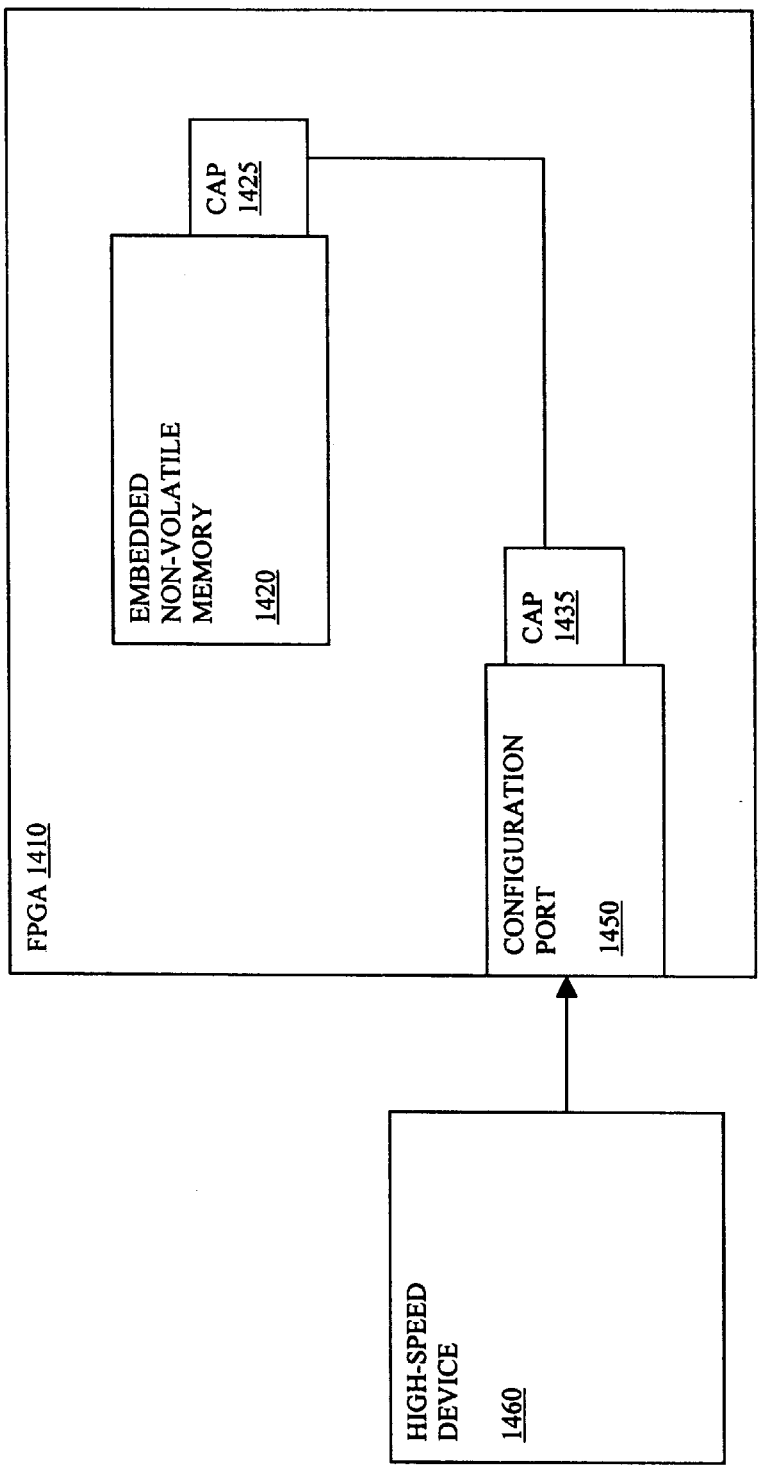
FIG. 14 is a schematic diagram of an FPGA with an embedded non-volatile memory to configure a user logic configuration port to interface with a high-speed device in accordance with one embodiment of the present invention.

FIG. 14 illustrates a specialized logic circuit configured by an embedded non-volatile memory in accordance with another embodiment of the present invention. Specifically, embedded non-volatile memory 1420 of an FPGA 1410 contains configuration data to configure the user logic circuits of a portion of FPGA 1410 as a user logic configuration port 1450. Embedded non-volatile memory 1420 programs the configuration memory of FPGA 1410 through an internal configuration access port 1425. Similarly, user logic configuration port 1450 is configured to access the configuration memory of FPGA 1410 through a second internal configuration access port 1435. Configuration port 1450 is also configured to interface with a high-speed device 1460 in the same manner as described above with respect to FIG. 5. Thus, the embodiment of FIG. 14 allows high-speed configuration of FPGA 1410 without requiring an external configuration device. After high-speed device 1460 configures the other portions of FPGA 1410, the portion of FPGA 1410 used for configuration port 1450 can be partially reconfigured by either high-speed device 1460 or embedded non-volatile memory 1420. Alternatively, embedded non-volatile memory 1420 can completely reconfigure the portion of FPGA 1410 used for configuration port 1450.

Figure 15:
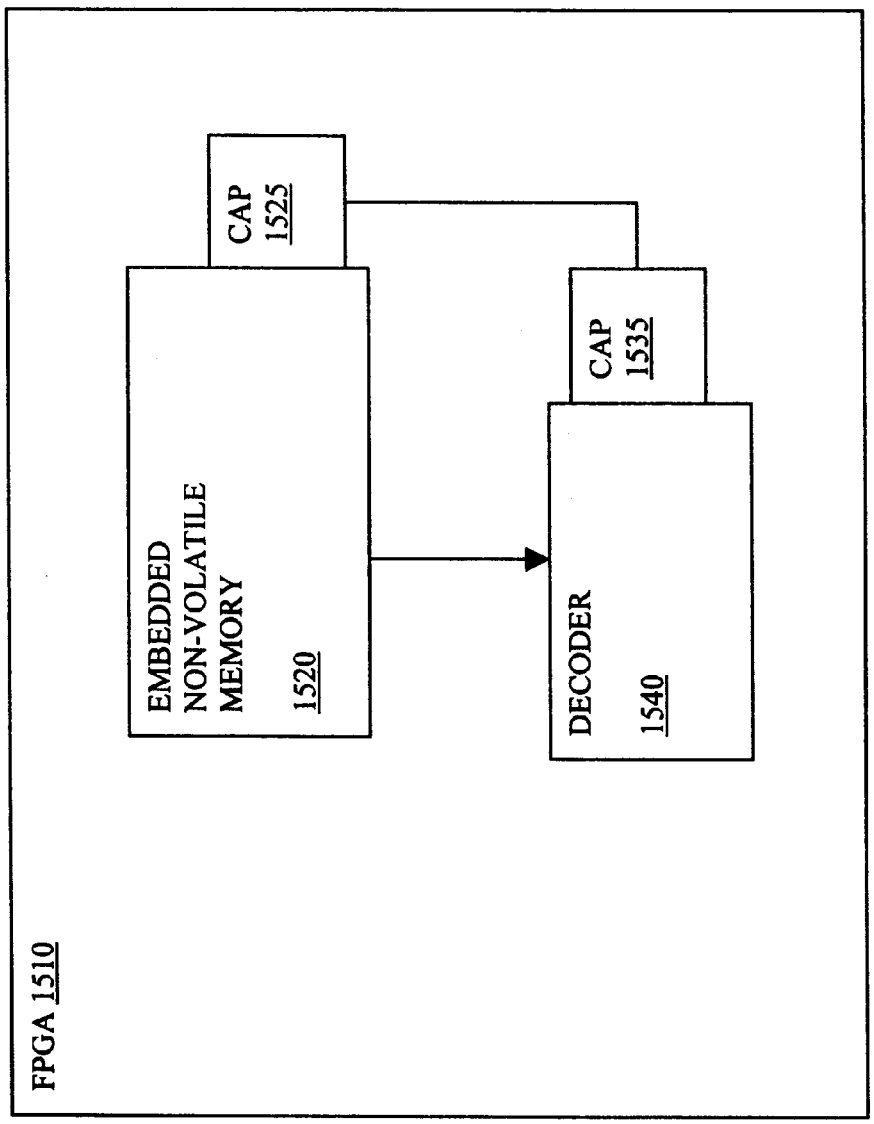
FIG. 15 is a schematic diagram of an FPGA with an embedded non-volatile memory to create a decoder to configure the FPGA in accordance with one embodiment of the present invention.

FIG. 15 shows another embodiment of the present invention. If embedded non-volatile memory 1520 is to configure FPGA 1510, embedded non-volatile memory 1520 can first configure a decoder 1540 to assist in the configuration of FPGA 1510. Specifically, embedded non-volatile memory 1520 configures the user logic circuits of a portion of FPGA 1510 as a decoder 1540 through internal configuration access port 1525. Decoder 1540 then receives encoded configuration data from embedded non-volatile memory 1520. After decoding the encoded configuration data, decoder 1540 configures other portions of FPGA 1510 through internal configuration access port 1535. Decoder 1540 can be, for example, an interpreter, as described with respect to FIG. 11, or a decompression unit, as described with respect to FIG. 9. After configuration of the other portions of FPGA 1510, embedded non-volatile memory 1520 can reconfigure the portion of FPGA 1510 previously configured as decoder 1540 into other logic circuits. Using decoder 1540 may reduce the size of embedded non-volatile memory 1520 since the amount of configuration data necessary to configure FPGA 1510 may be reduced, for example by data compression.

Figure 16:
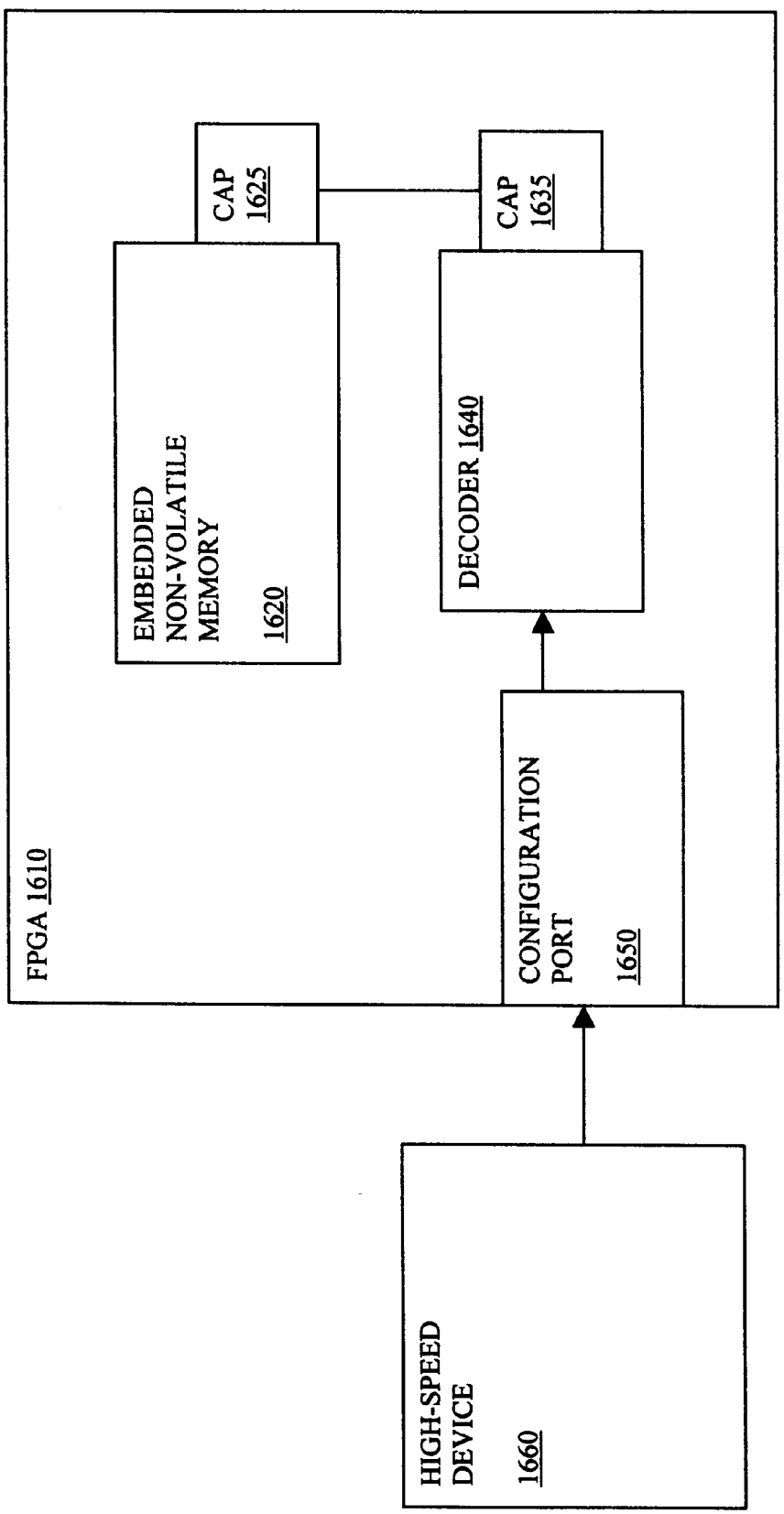
FIG. 16 is a schematic diagram of an FPGA with an embedded non-volatile memory to create a decoder to configure the FPGA from a high-speed device in accordance with one embodiment of the present invention.

FIG. 16 illustrates another embodiment of the present invention. In FIG. 16, an FPGA 1610 is coupled to a high-speed device 1660. On power-on or reset, an embedded non-volatile memory 1620 programs the configuration memories of FPGA 1610 through internal configuration access port 1625. Specifically, embedded non-volatile memory 1620 configures the user logic circuits of a first portion of FPGA 1610 as a decoder 1640, which is capable of programming the configuration memory of FPGA 1610 through a second internal configuration access port 1635. Embedded non-volatile memory 1620 also configures the user logic circuits of a second portion of FPGA 1610 to form a user logic configuration port 1650 coupled to decoder 1640. User logic configuration port 1650 receives encoded configuration data from high-speed device 1660 and sends the encoded configuration data to decoder 1640. Decoder 1640 decodes the encoded configuration data and programs other portions of FPGA 1610 through configuration access port 1635. After the other portions of FPGA 1610 are configured, the portions of FPGA 1610 used for configuration port 1650 and decoder 1640 can be reconfigured by either high-speed device 1660 or embedded non-volatile memory 1620, as described with respect to FIG. 8.

In the various embodiments of this invention, methods and structures have been described that reduce the problem of slow configuration time for FPGAs. By using decoders, on board memory, configuration ports, or high-speed devices to configure FPGAs, FPGAs are rapidly configured without using expensive configuration devices. Thus, digital systems can incorporate flexible FPGAs solutions without suffering through long configuration times or bearing high material costs for large configuration devices.

The various embodiments of the structures and methods of this invention that are described above are illustrative only of the principles of this invention and are not intended to limit the scope of the invention to the particular embodiments described. For example, in view of this disclosure, those skilled in the art can define other decoders, high-speed devices, configuration devices, FPGAs, CLBs, IOBs, PSMs, configuration access ports, configuration ports, specialized logic circuits, decompression units, interpreters, and so forth, and use these alternative features to create a method, circuit, or system according to the principles of this invention. Thus, the invention is limited only by the following claims.

What is claimed is:

1. A method for configuring a field programmable gate array (FPGA) having a first configuration access port, the method comprising the steps of:
   configuring a first portion of the FPGA as a decoder through the first configuration access port;
   transferring encoded configuration data to the decoder; and
   configuring a second portion of the FPGA using the encoded configuration data.

2. The method of claim 1, further comprising the step of decoding the encoded configuration data.

3. The method of claim 1, wherein the second portion of the FPGA is configured through a second configuration access port.

4. The method of claim 1, wherein the encoded configuration data comprises compressed configuration data.

5. The method of claim 4, further comprising the step of decompressing the compressed configuration data with the decoder.

6. The method of claim 1, wherein the encoded configuration data comprises one or more configuration commands.

7. The method of claim 6, further comprising the step of interpreting the configuration commands.

8. The method of claim 1, wherein the FPGA comprises an embedded non-volatile memory, the method further comprising the step of transferring the encoded configuration data from the embedded non-volatile memory to the first configuration access port.

9. The method of claim 8, further comprising the step of programming the encoded configuration data into the embedded non-volatile memory.

10. The method of claim 1, wherein the FPGA comprises a dedicated configuration port, and the encoded configuration data is transferred to the decoder through the configuration port.

11. The method of claim 1, further comprising the step of reconfiguring the first portion of the FPGA after configuring a second portion of the FPGA using the encoded configuration data.

12. The method of claim 1, further comprising the step of configuring a third portion of the FPGA as a first configuration port.

13. The method of claim 12, wherein the encoded configuration data is transferred to the decoder from the first configuration port.

14. The method of claim 13, further comprising the step of reconfiguring the first portion of the FPGA.

15. The method of claim 14, further comprising the step of reconfiguring the second portion of the FPGA.

16. A field programmable gate array (FPGA) having user logic circuits and a configuration structure, the FPGA comprising:

an internal configuration access port coupling the user logic circuits to the configuration structure; and an embedded non-volatile memory coupled to the configuration access port, the embedded non-volatile memory comprising a first set of configuration data to configure a first portion of the FPGA as a decoder for decoding additional configuration data.

17. The FPGA of claim 16, wherein the embedded non-volatile memory further comprises encoded configuration data to configure a second portion of the FPGA.

18. The FPGA of claim 16, wherein the embedded non-volatile memory further comprises a second set of configuration data to configure a second portion of the FPGA as a configuration port.

19. The FPGA of claim 16, wherein the embedded non-volatile memory further comprises a second set of configuration data to reconfigure the first portion of the FPGA.

20. The FPGA of claim 16, wherein the decoder comprises a decompression unit.

21. The FPGA of claim 16, wherein the decoder comprises an interpreter.

22. A configuration device for configuring a field programmable gate array (FPGA), the configuration device comprising:

an interface to couple the configuration device to a first configuration port of the FPGA; and a first memory coupled to the interface, the first memory comprising a first set of configuration data to configure a first portion of the FPGA as a decoder for decoding additional configuration data.

23. The configuration device of claim 22, wherein the first memory further comprises a second set of configuration data to configure a second portion of the FPGA as a second configuration port.

24. The configuration device of claim 22, wherein the first memory further comprises encoded configuration data to configure a second portion of the FPGA.

25. The configuration device of claim 22, wherein the first memory further comprises a second set of configuration data to reconfigure the first portion of the FPGA.

26. The configuration device of claim 22, further comprising a second memory comprising a second set of configuration data to reconfigure the first portion of the FPGA.

27. The configuration device of claim 22, wherein the decoder comprises a decompression unit.

28. The configuration device of claim 22, wherein the decoder comprises an interpreter.

29. The configuration device of claim 22, wherein the configuration device comprises a non-volatile memory.

* * * * *